(12) United States Patent
Wu et al.

(10) Patent No.: US 11,043,264 B2
(45) Date of Patent: *Jun. 22, 2021

(54) STATIC RANDOM ACCESS MEMORY METHOD

(71) Applicant: TAIWAN SEMICONDUCTOR MANUFACTURING COMPANY, LTD., Hsinchu (TW)

(72) Inventors: Wei-Cheng Wu, Hsinchu (TW); Wei Min Chan, Sindian (TW); Yen-Huei Chen, Jhudong Township (TW); Hung-Jen Liao, Hsinchu (TW); Ping-Wei Wang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/884,774

(22) Filed: May 27, 2020

(65) Prior Publication Data

US 2020/0286550 A1    Sep. 10, 2020

Related U.S. Application Data

(60) Continuation of application No. 16/241,717, filed on Jan. 7, 2019, now Pat. No. 10,685,704, which is a continuation of application No. 15/633,167, filed on Jun. 26, 2017, now Pat. No. 10,176,864, which is a continuation of application No. 15/012,970, filed on Feb. 2, 2016, now Pat. No. 9,704,565, which is a division of application No. 14/308,065, filed on Jun. 18, 2014, now Pat. No. 9,281,056.

(51) Int. Cl.
| | |
|---|---|
| *G11C 11/41* | (2006.01) |
| *G11C 11/419* | (2006.01) |
| *G11C 11/4063* | (2006.01) |
| *G11C 11/409* | (2006.01) |
| *G11C 11/412* | (2006.01) |

(52) U.S. Cl.
CPC .......... *G11C 11/419* (2013.01); *G11C 11/409* (2013.01); *G11C 11/4063* (2013.01); *G11C 11/41* (2013.01); *G11C 11/412* (2013.01)

(58) Field of Classification Search
None
See application file for complete search history.

(56) References Cited

U.S. PATENT DOCUMENTS

| | | | |
|---|---|---|---|
| 4,639,899 A | 1/1987 | Murphy et al. | |
| 5,267,197 A * | 11/1993 | McClure | G11C 7/1048 365/189.15 |
| 5,325,338 A | 6/1994 | Runaldue | |
| 5,453,949 A | 9/1995 | Wiedmann | |
| 5,546,345 A | 8/1996 | Wada | |
| 5,687,111 A | 11/1997 | Wada | |

(Continued)

*Primary Examiner* — Tan T. Nguyen
(74) *Attorney, Agent, or Firm* — Hauptman Ham, LLP

(57) ABSTRACT

A method of performing a write operation on a static random access memory (SRAM) bit cell includes activating the bit cell by supplying a signal to a p-type pass gate of the bit cell, the signal causing the p-type pass gate to be in a conductive state, using a p-type transistor of a write multiplexer to maintain a data line at a logically high voltage, and transferring bit information from the data line to the activated bit cell using the p-type pass gate.

20 Claims, 10 Drawing Sheets

(56) References Cited

U.S. PATENT DOCUMENTS

| | | |
|---|---|---|
| 5,706,226 A | 1/1998 | Chan |
| 5,973,984 A | 10/1999 | Nagaoka |
| 6,111,780 A | 8/2000 | Bertin |
| 6,552,923 B2 | 4/2003 | Houston |
| 7,724,565 B2 | 5/2010 | Barth, Jr. |
| 8,995,175 B1 | 3/2015 | Liu |
| 9,281,056 B2 | 3/2016 | Wu et al. |
| 9,704,565 B2 | 7/2017 | Wu et al. |
| 10,176,864 B2 | 1/2019 | Wu |
| 10,685,704 B2 * | 6/2020 | Wu ........................ G11C 11/412 |
| 2004/0141362 A1 | 7/2004 | Sumitani et al. |
| 2008/0117665 A1 | 5/2008 | Abeln |
| 2010/0091581 A1 | 4/2010 | Van Winkelhoff |
| 2014/0112060 A1 | 4/2014 | Adams et al. |
| 2014/0153323 A1 | 6/2014 | Liaw |
| 2015/0348598 A1 | 12/2015 | Wang |

* cited by examiner

STATIC RANDOM ACCESS MEMORY METHOD

PRIORITY CLAIM

The present application is a continuation of U.S. application Ser. No. 16/241,717, filed Jan. 7, 2019, which is a continuation of U.S. application Ser. No. 15/633,167, filed Jun. 26, 2017, now U.S. Pat. No. 10,176,864, issued Jan. 8, 2019, which is a continuation of U.S. application Ser. No. 15/012,970, filed Feb. 2, 2016, now U.S. Pat. No. 9,704,565, issued Jul. 11, 2017, which is a divisional of U.S. application Ser. No. 14/308,065, filed Jun. 18, 2014, now U.S. Pat. No. 9,281,056, issued Mar. 8, 2016, which are incorporated herein by reference in their entireties.

BACKGROUND

Static random access memory (SRAM) is a type of volatile semiconductor memory that stores data bits using bi-stable circuitry. Bi-stable circuitry will maintain the integrity of a stored bit without refreshing. A single SRAM cell is referred to as a bit cell because the single SRAM cell stores one bit of information, represented by a logic state of two cross coupled inverters. Memory arrays include multiple bit cells arranged in rows and columns. In some approaches, each bit cell in a memory array includes a connection to a power supply voltage and a connection to a reference voltage. Logic signals on bit lines control reading from and writing to a bit cell, with a word line controlling connections of the bit lines to the cross-coupled inverters through pass gates. When the pass gates are in a non-conductive state, the bit cell floats.

Scaling of semiconductor devices, e.g., a metal-oxide semiconductor field-effect transistor (MOSFET), has enabled continued improvement in speed, performance, density, and cost per unit function of integrated circuits over the past few decades. The reduced size of MOSFETs results in changes to carrier mobility, which in turn impacts a drive current through the MOSFET.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
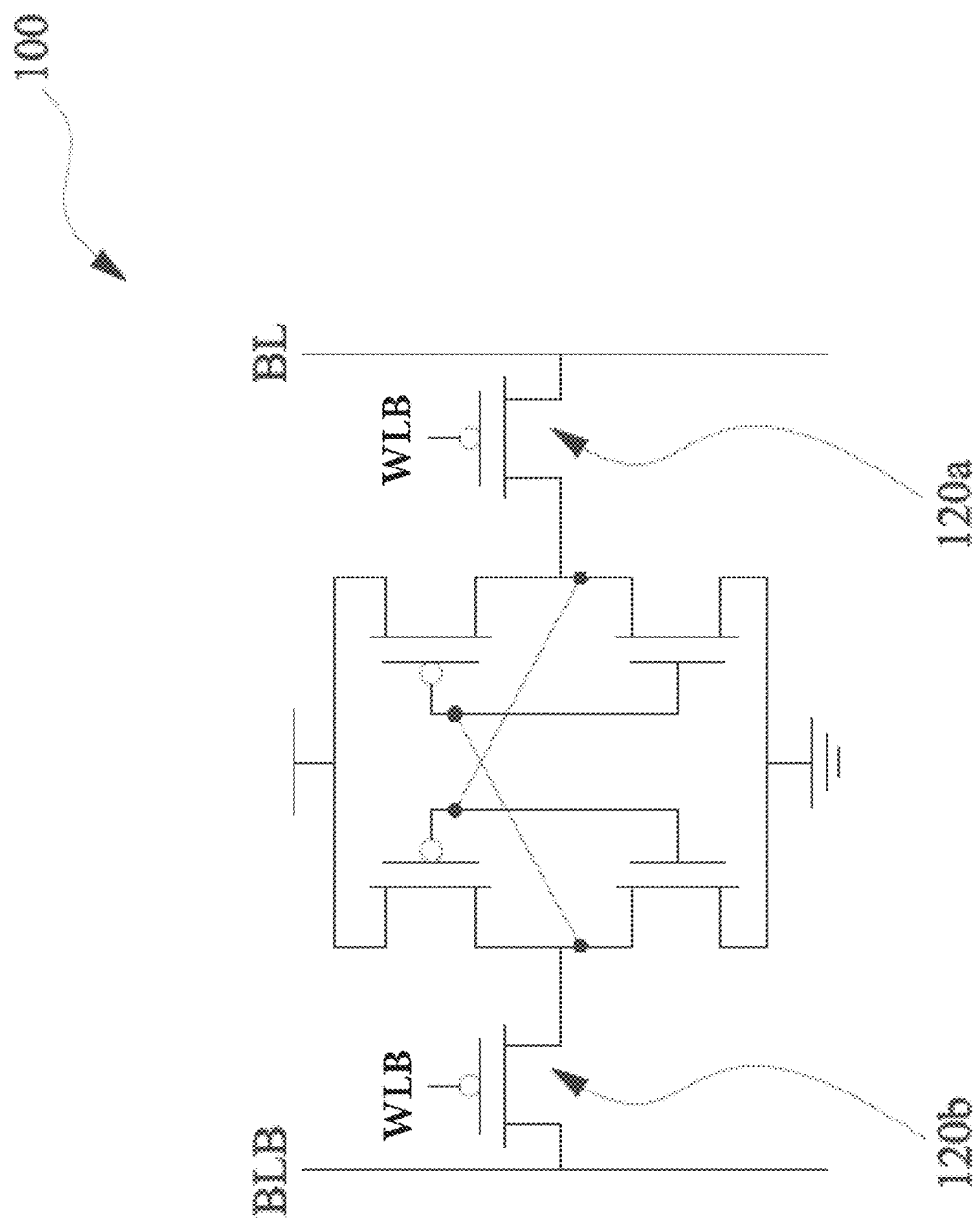
FIG. 1 is a schematic diagram of a single port bit cell in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 is a schematic diagram of a single-port bit cell 100 in accordance with some embodiments. Single-port bit cell 100 includes cross-coupled inverters 110 which are capable of storing information. A first pass gate 120a is configured to selectively connect cross-coupled inverters 110 to a bit line BL. A second pass gate 120b is configured to selectively connect cross-coupled inverters 110 to a bit line bar BLB. First pass gate 120a and second pass gate 120b are both configured to be activated based on a signal supplied by a word line bar WLB.

Single-port bit cell 100 includes p-type pass gates. In some embodiments, first pass gate 120a and second pass gate 120b are both p-type metal-oxide-semiconductor (PMOS) transistors. In some embodiments, first pass gate 120a and second pass gate 120b include three-dimensional gate structures, e.g. fin field-effect-transistors (FinFET).

In contrast with bit cells which include n-type transistors for pass gates, single-port bit cell 100 is connected to bit line BL and bit line bar BLB by a logically low signal at a gate of first pass gate 120a and second pass gate 120b.

As semiconductor devices are scaled down, a driving strength of a p-type transistor increases in comparison with a driving strength of an n-type transistor. The result is that higher currents are able to be conveyed through p-type transistors in scaled down semiconductor devices. By using p-type transistors for first pass gate 120a and second pass gate 120b for scaled down semiconductor devices, bit information stored in cross-coupled inverters 110 is conveyed to bit line BL or bit line bar BLB more rapidly in comparison with scaled down semiconductor devices which include n-type transistors for pass gates.

Figure 2:
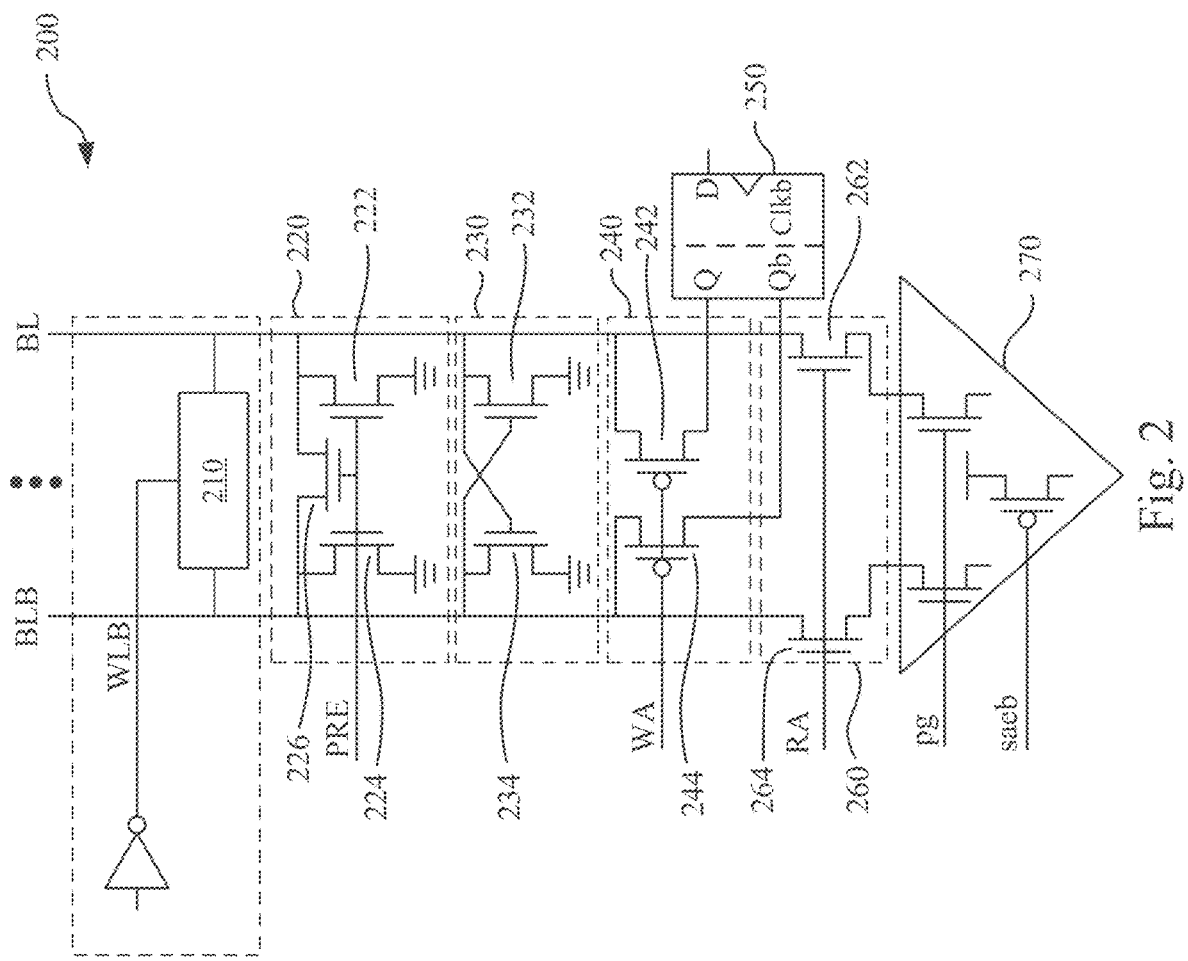
FIG. 2 is a schematic diagram of a single-port static random access memory (SRAM) in accordance with some embodiments.

FIG. 2 is a schematic diagram of a single-port static random access memory (SRAM) 200 in accordance with some embodiments. Single-port SRAM 200 includes a single-port bit cell 210 configured to receive a signal along word line bar WLB. Single-port bit cell 210 is connected to bit line BL and bit line bar BLB. Single-port SRAM 200 further includes a discharge circuit 220 configured to discharge bit line BL and bit line bar BLB to a reference voltage in response to a pre-discharge signal PRE. Single-port SRAM 200 further includes cross-coupled transistors 230 connected to bit line BL and bit line bar BLB. Cross-coupled transistors 230 are configured to help maintain a voltage level on bit line BL and bit line bar BLB. A write multiplexer 240 is also connected to bit line BL and bit line bar BLB. Write multiplexer 240 is configured to help maintain bit line BL or bit line bar BLB in a high logical state during a write operation. A flip-flop 250 is connected to write multiplexer 240. Single-port SRAM further includes a read multiplexer 260 connected to bit line BL and bit line bar BLB. Read multiplexer 260 is configured to transfer a voltage value close to the reference voltage to a sense amplifier 270 during a reading operation. Sense amplifier 270 is also connected to bit line BL and bit line bar BLB.

Single-port bit cell 210 is configured to store bit information. Single-port bit cell 210 includes p-type pass gates. In some embodiments, single-port bit cell 210 is a six transistor (6T) bit cell. In some embodiments, single-port bit cell 210 is similar to single-port bit cell 100 (FIG. 1). In some embodiments, single-port bit cell 210 includes transistors having three dimensional gate structures, e.g., FinFET.

Single-port bit cell 210 is configured to receive a signal on write line bar WLB in order to selectively transfer bit information from the single-port bit cell to bit line BL and bit line bar BLB. Due to the p-type pass gates, the bit information is transferred to bit line BL and bit line bar BLB when the signal on word line bar WLB is logically low. In some embodiments, an inverter is used to convert a logically high activation signal from peripheral circuitry to a logically low signal on word line bar WLB to activate single-port bit cell 210. The inverter facilitates use of single-port SRAM 200 in integrated circuits without adjustments to the peripheral circuitry which are designed for use with bit cells having n-type pass gates.

Pre-discharge circuit 220 includes a first n-type transistor 222 configured to receive pre-discharge signal PRE. A source of first n-type transistor 222 is connected to the reference voltage. A drain of first n-type transistor 222 is connected to bit line BL. Pre-discharge circuit 220 further includes a second n-type transistor 224 configured to receive pre-discharge signal PRE. A source of second n-type transistor 224 is connected to the reference voltage. A drain of second n-type transistor 224 is connected to bit line bar BLB. Pre-discharge circuit 220 further includes a third n-type transistor 226 configured to receive pre-discharge signal PRE. A source of third n-type transistor 226 is connected to bit line BL. A drain of third n-type transistor 226 is connected to bit line bar BLB. In some embodiments, third n-type transistor 226 is omitted. In some embodiments, the reference voltage is a ground voltage. In some embodiments, the reference voltage is different from the ground voltage.

First n-type transistor 222 is configured to connect bit line BL to the reference voltage based on pre-discharge signal PRE, to set the voltage level on bit line BL to a logically low value. Second n-type transistor 224 is configured to connect bit line bar BLB to the reference voltage based on pre-discharge signal PRE, to set the voltage level on bit line bar BLB to a logically low value. Third n-type transistor 226 is configured to selectively connect bit line BL to bit line bar BLB to equalize the voltage level on the bit line to the voltage level on the bit line bar. In some embodiments where third n-type transistor 226 is omitted, the voltage level on bit line BL is different from the voltage level on bit line bar BLB due to variations between first n-type transistor 222 and second n-type transistor 224 caused by production variations.

In operation, pre-discharge circuit 220 sets the voltage level of bit line BL and the voltage level of bit line bar BLB to a logically low value prior to a read operation. The n-type transistors in pre-discharge circuit 220 have a better intrinsic characteristic for transferring low voltage values in comparison with p-type transistors. It helps to establish the logically low voltage level on bit line BL and bit line bar BLB faster, which in turn facilitates high operating frequencies for single-port SRAM 200.

Cross-coupled transistors 230 include a first n-type cross-coupled transistor 232 having a gate connected to bit line bar BLB. A source of first n-type cross-coupled transistor 232 is connected to the reference voltage. A drain of first n-type cross-coupled transistor 232 is connected to bit line BL. Cross-coupled transistors 230 further include a second n-type cross-coupled transistor 234 having a gate connected to bit line BL. A source of second n-type cross-coupled transistor 234 is connected to the reference voltage. A drain of second n-type cross-coupled transistor 234 is connected to bit line bar BLB.

Cross-coupled transistors 230 are configured to help prevent current fighting during read operations and write operations. For example, during a read operation where bit line BL has a logically low value and bit line bar BLB has a logically high value, first n-type cross-coupled transistor 232 is activated by the logically high value on bit line bar BLB to connect bit line BL to the reference voltage. Also, second n-type cross-coupled transistor 234 is de-activated by the logically low value on bit line BL to disconnect bit line bar BLB from the reference voltage.

In operation, cross-coupled transistors 230 help to prevent read errors and write errors by maintaining a difference between the voltage level on bit line BL and the voltage level on bit line bar BLB. The difference between the voltage levels helps to compensate current fighting during the read operation and improve the write ability during write operation, which in turn helps to facilitate stable read operations and write operations.

Write multiplexer 240 includes a first p-type transistor 242 configured to receive a write activation signal WA. A source of first p-type transistor 242 is connected to bit line BL. A drain of first p-type transistor 242 is connected to a first output of flip-flop 250. Write multiplexer 240 further includes a second p-type transistor 244 configured to receive write activation signal WA. A source of second p-type transistor is connected to bit line bar BLB. A drain of second p-type transistor is connected to a second output of flip-flop 250. In some embodiments, at least one of first p-type transistor 242 or second p-type transistor 244 is replaced with a transmission gate. A transmission gate is capable of transferring logically high voltages at a similar speed as a p-type transistor; however, the transmission gate occupies a larger area of a circuit and reduces an ability to scale down the circuit, in some instances.

Write multiplexer 240 is configured to help maintain a logically high voltage value on bit line BL or bit line bar BLB. In some instances, current leakage through other devices, such as cross-coupled transistors 230 or pre-discharge circuit 220, causes a decrease in a voltage level on bit line BL or bit line bar BLB. Write multiplexer 240 is configured to help prevent the decreasing of the voltage level on bit line BL or bit line bar BLB, which in turn helps to facilitate faster write operations and reduce a risk of write errors. Using p-type transistors in write multiplexer 240 helps to provide sufficient signal transmission with a lower circuit area than a transmission gate.

In operation, write activation signal WA activates first p-type transistor 242 and second p-type transistor 244 to connect the first output of flip-flop 250 to bit line BL and to connect the second output of flip-flop 250 to bit line bar BLB. Using p-type transistors in write multiplexer 240, helps to provide sufficient transfer of a logically high value to effectively maintain a high logical value on bit line BL or bit line bar BLB.

Flip-flop 250 is configured to supply a high logical value to first p-type transistor 242 or second p-type transistor 244. Flip-flop 250 is configured to receive a data input and a clock input. The first output of flip-flop 250 is connected to first p-type transistor 242. The second output of flip-flop 250 is connected to second p-type transistor 244. Based on the data signal and the clock signal, flip-flop 250 is able to assist write multiplexer 240 in maintaining the logically high voltage level on bit line BL or bit line bar BLB.

Read multiplexer 260 includes a first n-type read transistor 262 configured to receive a read activation signal RA. A source of first n-type read transistor 262 is connected to sense amplifier 270. A drain of first n-type read transistor 262 is connected to bit line BL. Read multiplexer 260 include a second n-type read transistor 264 configured to receive read activation signal RA. A source of second n-type read transistor 264 is connected to sense amplifier 270. A drain of second n-type read transistor 264 is connected to bit line bar BLB.

Read multiplexer 260 is configured to transfer the voltage level on bit line BL to sense amplifier 270 and to transfer the voltage level on bit line bar BLB to sense amplifier 270. Single-port bit cell 210 is configured to store bit information which is transferred to bit line BL or bit line bar BLB. In some instances, a magnitude of a change in the voltage level on bit line BL or bit line bar BLB, due to transfer of the bit information, is small. Use of n-type transistors in read multiplexer 260 enables more rapid transfer of voltage levels close to the reference voltage than a read multiplexer which includes p-type transistors. As a result, a speed of a read operation is increased by using n-type transistors. Using n-type transistors in read multiplexer 260 helps to provide sufficient signal transmission with a lower circuit area than a transmission gate.

In operation, read activation signal RA activates first n-type read transistor 262 and second n-type read transistor 264 to connect bit line BL and bit line bar BLB to sense amplifier 270. Using n-type transistors in read multiplexer 260, helps to provide sufficient transfer of logically low values to increase the speed of the read operation.

Sense amplifier 270 is configured to receive bit information transferred from single-port bit cell 210 to bit line BL or bit line bar BLB. Sense amplifier 270 is configured to detect an increase in a voltage level above the reference voltage.

Figure 3:
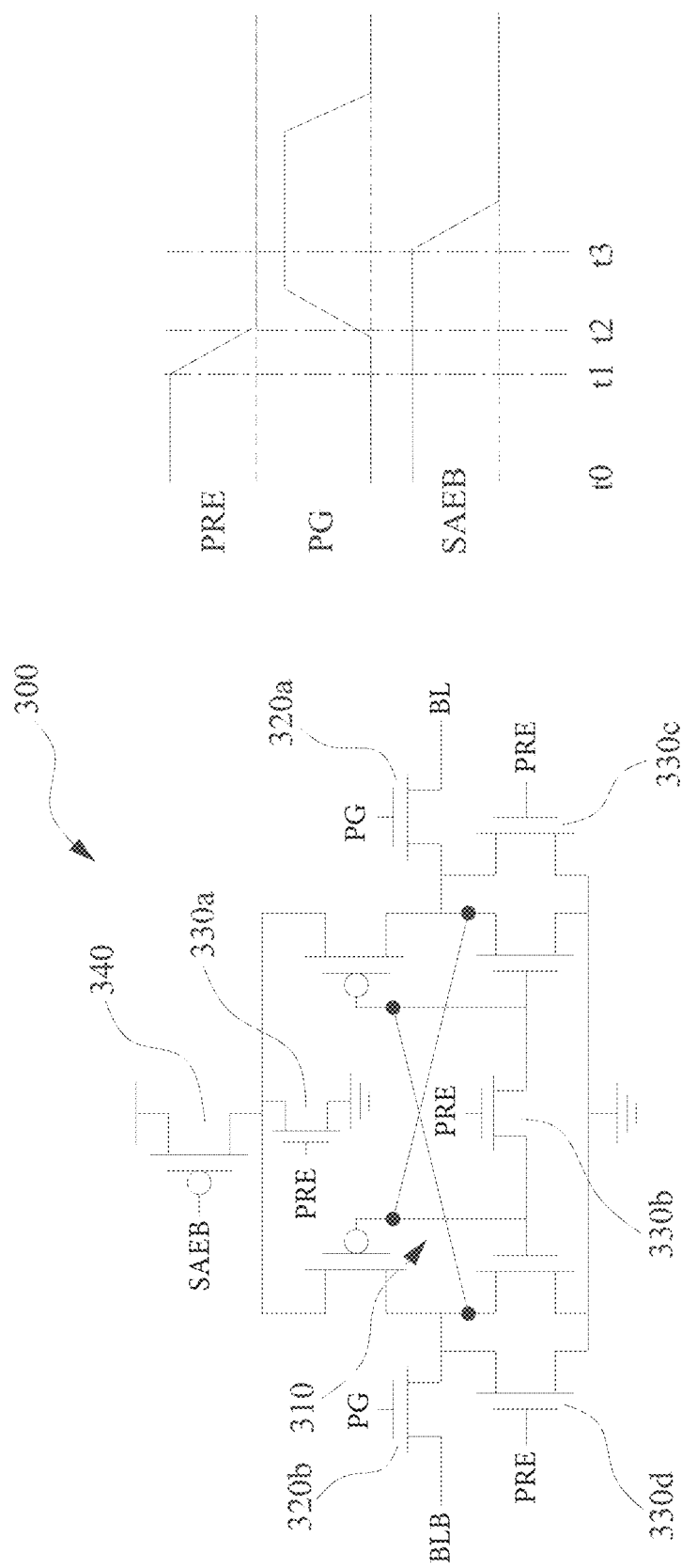
FIG. 3A is a schematic diagram of a sense amplifier of an SRAM in accordance with some embodiments.
FIG. 3B is a waveform diagram of signals applied to a sense amplifier of an SRAM in accordance with some embodiments.

FIG. 3A is a schematic diagram of a sense amplifier 300 of an SRAM in accordance with some embodiments. Sense amplifier 300 includes cross-coupled inverters 310. Sense amplifier 300 further includes a first pass gate 320a connected to a first side of cross-coupled inverters 310. First pass gate 320a is configured to selectively connect bit line BL to cross-coupled inverters 310. Sense amplifier 300 further includes a second pass gate 320b connected to a second side of cross-coupled inverters 310. Second pass gate 320b is configured to selectively connect bit line bar BLB to cross-coupled inverters 310. Sense amplifier 300 further includes a first sense amplifier (SA) pre-discharge transistor 330a configured to selectively connect a source of each p-type transistor of cross-coupled inverters 310 to the reference voltage. A second SA pre-discharge transistor 330b is configured to selectively connect together each gate of cross-coupled inverters 310. A third SA pre-discharge transistor 330c is configured to selectively connect the first side of cross-coupled inverters 310 to the reference voltage. A fourth SA pre-discharge transistor 330d is configured to selectively connect the second side of cross-coupled inverters 310 to the reference voltage. An enabling transistor 340 is configured to selectively connect cross-coupled inverters 310 to an operating voltage.

In some embodiments, sense amplifier 270 (FIG. 2) is the same as sense amplifier 300.

FIG. 3B is a waveform diagram of signals applied to sense amplifier 300 of an SRAM in accordance with some embodiments. At time t0, pre-discharge signal PRE is logically high; pass gate signal PG is logically low; and a sense amplifier enable bar signal SAEB is logically low. At time t1, pre-discharge signal PRE begins falling to a logically low value. At time t2, pass gate signal PG begins rising to a logically high value. At time t3, sense amplifier enable bar signal SAEB begins falling to a logically low value.

Applying the waveforms of FIG. 3B to sense amplifier 300 of FIG. 3A, an operation of the sense amplifier is described, according to some embodiments. In operation, first SA pre-discharge transistor 330a; second SA pre-discharge transistor 330b; third SA pre-discharge transistor 330c; and fourth SA pre-discharge transistor 330d are all conductive due to the high logical value of pre-discharge signal PRE. First pass gate 320a; second pass gate 320b and enabling transistor 340 are all non-conductive due to the logically low value of pass gate signal PG and the logically high value of sense amplifier enabling bar signal SAEB. As a result, the gates of cross-coupled inverters 310 are connected together. The first side and the second side of cross-coupled inverters 310 are connected to the reference voltage. The sources of the p-type transistors of cross-coupled inverters 310 are also connected to the reference voltage.

At time t1, first SA pre-discharge transistor 330a; second SA pre-discharge transistor 330b; third SA pre-discharge transistor 330c; and fourth SA pre-discharge transistor 330d are all de-activated by the falling edge of pre-discharge signal PRE. The result is that the gates of cross-coupled inverters 310 are disconnected. In addition, cross-coupled inverters 310 are disconnected from the reference voltage and are floated.

At time t2, first pass gate 320a is activated and bit line BL is connected to the first side of cross-coupled inverters 310. Second pass gate 320b is also activated and bit line bar BLB is connected to the second side of cross-coupled inverter 310.

At time t3, enabling transistor 340 is activated and cross-coupled inverters 310 are connected to the operating voltage. The operating voltage will pull-up a logically high voltage on bit line BL or bit line bar BLB facilitating detection of the bit information from a bit cell, e.g., single-port bit cell 210 (FIG. 2).

Figure 4:
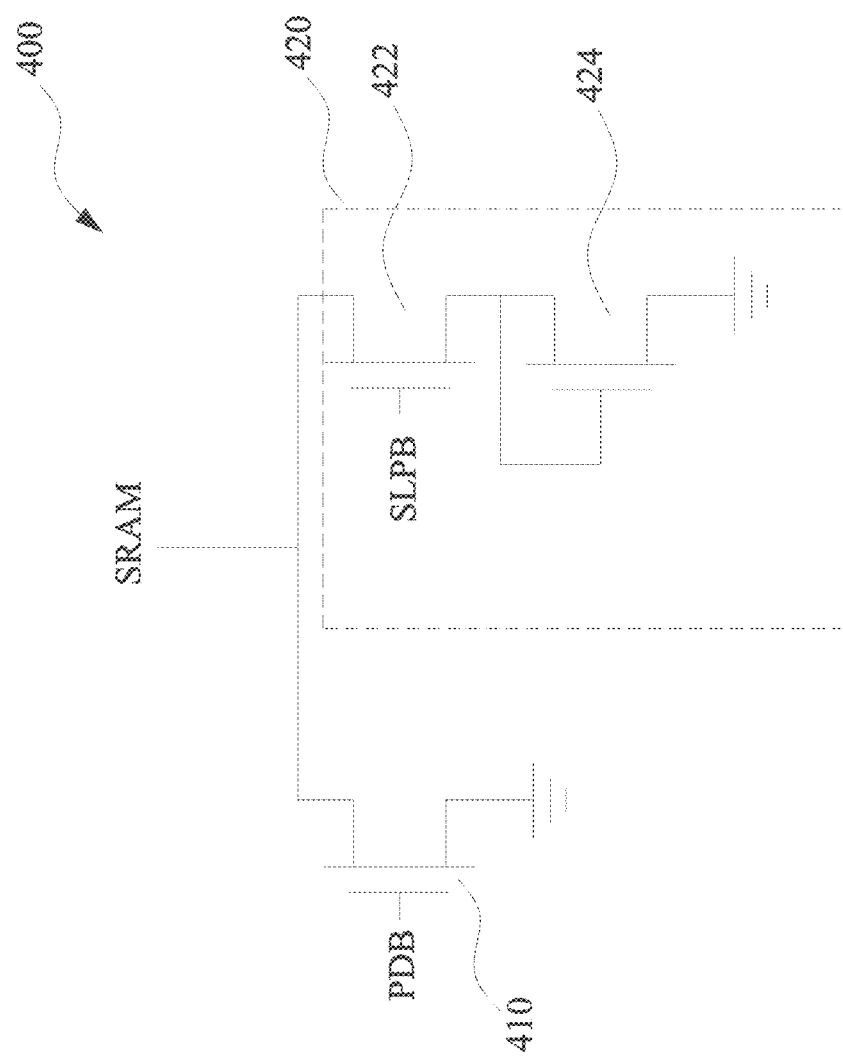
FIG. 4 is a schematic diagram of a footer of an SRAM in accordance with some embodiments.

FIG. 4 is a schematic diagram of a footer 400 of an SRAM in accordance with some embodiments. Footer 400 includes a power down transistor 410. Footer further includes a sleep leg 420. Footer 400 is configured to connect an SRAM to the reference voltage. Footer 400 is configured to conserve power during periods of time when the SRAM is not in use. Footer 400 includes an ability to permit operation of the SRAM in a low voltage setting, e.g., a sleep mode, and to completely interrupt power to the SRAM. In some embodiments, sleep leg 420 is omitted. In embodiments which do not include sleep leg 420, footer 400 is not able to permit operation of the SRAM in a low voltage setting.

Power down transistor 410 is configured to interrupt a power supply to the SRAM in response to a power down bar PDB signal. A source of power down transistor 410 is connected to the reference. A drain of power down transistor 410 is connected to the SRAM. In operation, power down bar signal PDB is logically high during operation of the SRAM. During a power down state of the SRAM, power down bar signal PDB falls to logically low and power to the SRAM is interrupted. During the low power setting, power down bar signal PDB is logically low to prevent connection of the SRAM to the reference through power down transistor 410.

Sleep leg 420 includes a sleep transistor 422 configured to receive a sleep bar signal SLPB. Sleep transistor 422 is connected in series with a diode-connected sleep transistor 424. A drain of sleep transistor 422 is connected to the SRAM. A source of diode-connected sleep transistor 424 is connected to the reference voltage. In operation, a logical state of sleep bar signal SLPB is either logically high or logically low. During the power down state, sleep bar signal SLPB is logically low to interrupt power to the SRAM through sleep transistor 422. During the low power setting, sleep bar signal SLPB is logically high to connect the SRAM to the reference voltage through sleep transistor 422 and diode-connected sleep transistor 424. Diode-connected sleep transistor 424 acts a resistor to reduce an amount of power available to the SRAM to conserve power. In some embodiments, sleep leg 420 includes more than one diode-connected sleep transistor in order to adjust the power supplied to the SRAM during the low power setting.

Figure 5:
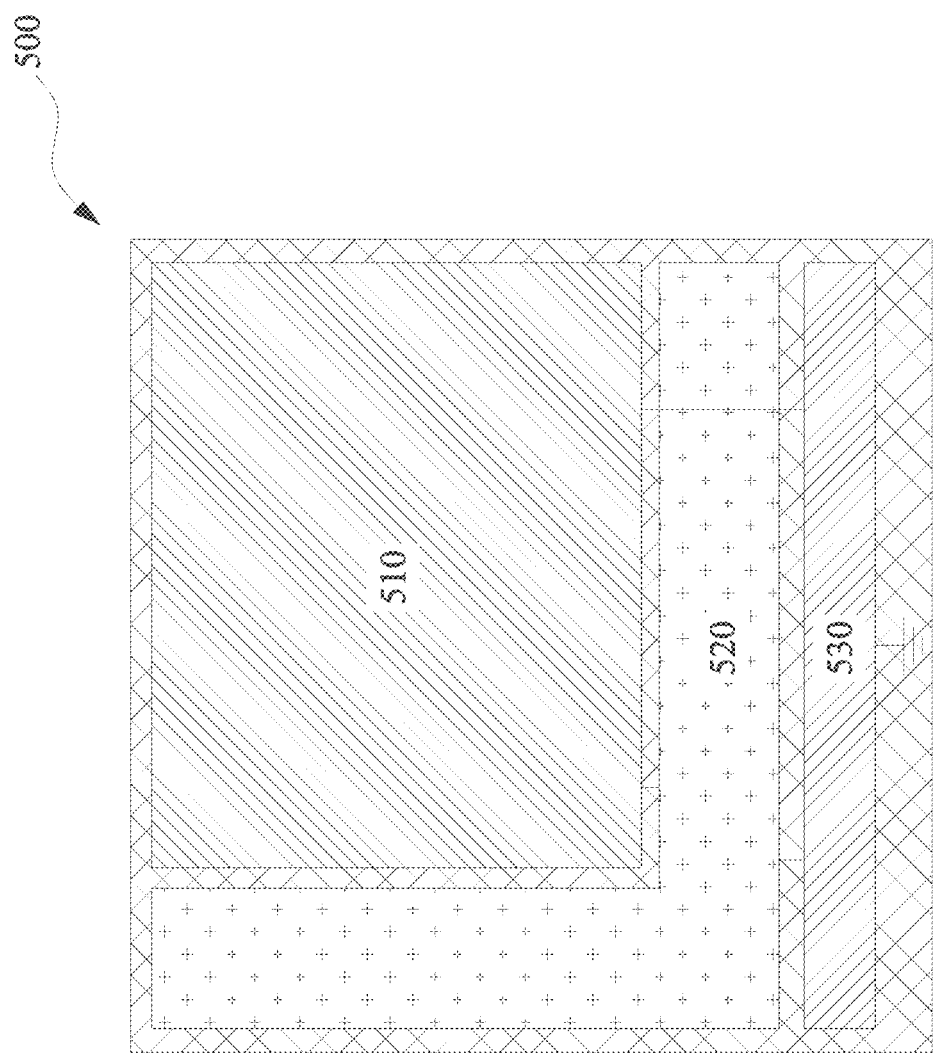
FIG. 5 is a block diagram of a power management system for an SRAM in accordance with some embodiments.

FIG. 5 is a block diagram of a power management system 500 for an SRAM in accordance with some embodiments. Power management system 500 includes an SRAM memory array 510. SRAM memory array 510 is connected to peripheral circuitry 520. SRAM memory array 510 is also connected to a power management block 530. Peripheral circuitry 520 is also connected to power management block 530.

SRAM memory array 510 includes SRAM memory components, e.g., SRAM memory 200 (FIG. 2). SRAM memory array 510 is configured to store bit information.

Peripheral circuitry 520 is configured to access SRAM memory array 510. In some embodiments, peripheral circuitry 520 includes an address decoder, error correction circuitry, clock circuitry, or other suitable circuitry. In some embodiments, an operating voltage of peripheral circuitry 520 is higher than an operating voltage of SRAM memory array 510. In some embodiments, the operating voltage of peripheral circuitry 520 is equal to the operating voltage of SRAM memory array 510.

Power management block 530 is configured to control power supplied to SRAM memory array 510 and power supplied to peripheral circuitry 520. In some embodiments, power management block includes a footer, e.g., footer 400. In some embodiments, a footer connected to peripheral circuitry 520 has a same structure as a footer connected to SRAM memory array 510. In some embodiments, the footer connected to peripheral circuitry 520 has a different structure from the footer connected to SRAM memory array 510.

Figure 6:
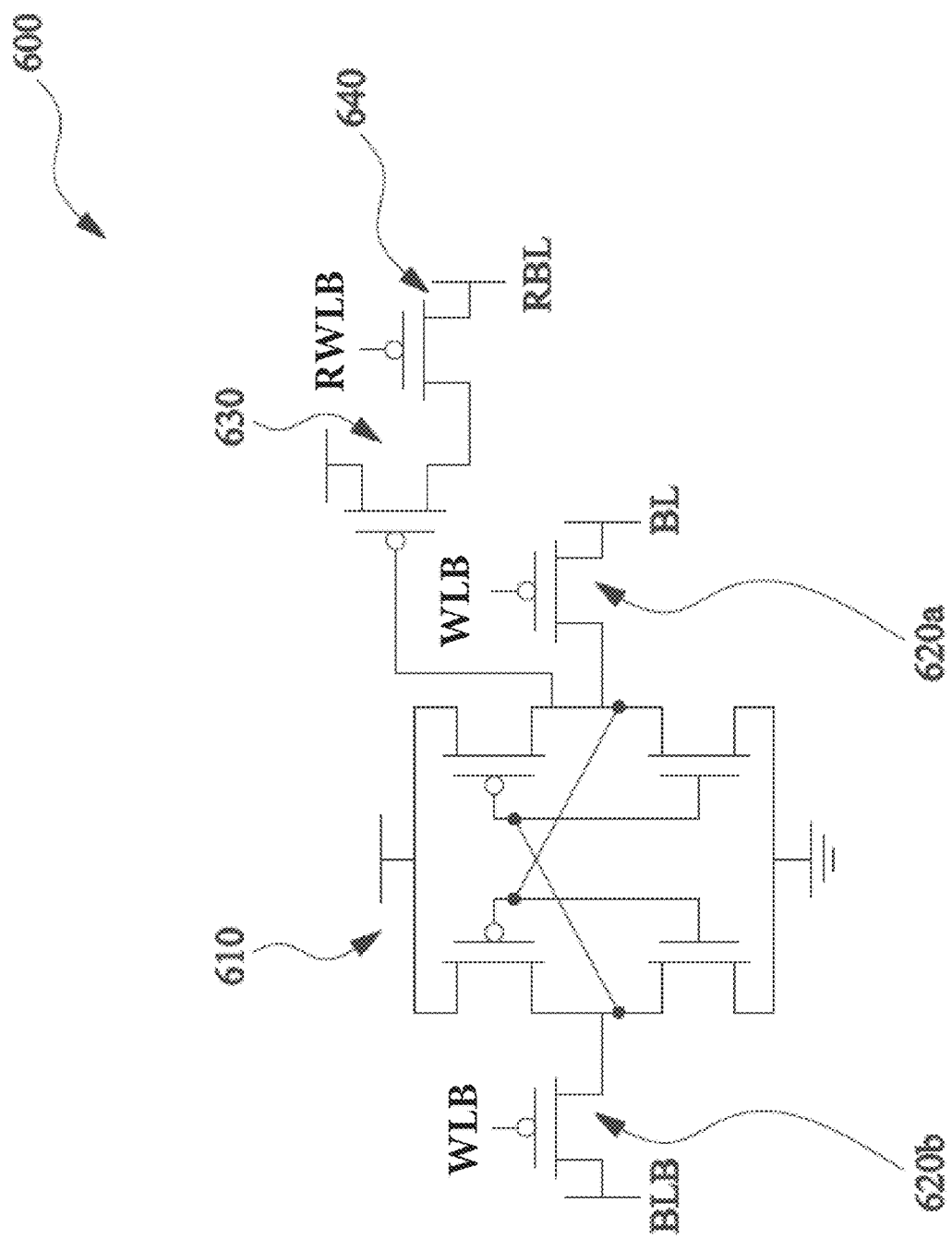
FIG. 6 is a schematic diagram of a two-port bit cell in accordance with some embodiments.

FIG. 6 is a schematic diagram of a two-port bit cell 600 in accordance with some embodiments. Two-port bit cell 600 includes cross-coupled inverters 610. Two-port bit cell 600 further includes a first pass gate 620a configured to selectively connect bit line BL to a first side of cross-coupled inverters 610. Two-port bit cell 600 further includes a second pass gate 620b configured to selectively connect bit line bar BLB to a second side of cross-coupled inverters 610. A read port transistor 630 is configured to be selectively activated based on a voltage at the first side of cross-coupled inverters 610. A read bit line pass gate 640 is configured to selectively connect a read bit line RBL to read port transistor 630.

Cross-coupled inverters 610 are similar to cross-coupled inverters 110 (FIG. 1). First pass gate 620a is similar to first pass gate 120a. Second pass gate 620b is similar to second pass gate 120b.

In contrast with single-port bit cell 100 (FIG. 1), two-port bit cell 600 includes read port transistor 630 and read bit line pass gate 640 to facilitate a read operation and a write operation to be performed on two-port bit cell 600 during a same cycle. Read port transistor 630 is a p-type transistor. In some embodiments, read port transistor 630 includes a three-dimensional gate structure, e.g., FinFET. A gate of read port transistor 630 is connected to the first side of cross-coupled inverters 610 and to first pass gate 620a. A source of read port transistor 630 is connected to an operating voltage of two-port bit cell 600. A drain of read port transistor 630 is connected to read bit line pass gate 640.

Read port transistor 630 is configured to selectively connect the operating voltage to read bit line pass gate 640 based on a voltage level stored on the first side of cross-coupled inverters 610. In operation, when a logically high value is stored on the first side of cross-coupled inverters 610, read port transistor 630 is non-conductive and read bit line pass gate 640 is floating. When a logically low value is stored on the first side of cross-coupled inverters 610, read port transistor 630 is conductive and read bit line pass gate 640 is connected to the operating voltage.

Read bit line pass gate 640 is a p-type transistor. In some embodiments, read bit line pass gate 640 includes a three-dimensional gate structure, e.g., FinFET. A gate of read bit line pass gate 640 is configured to receive a read word line bar signal RWLB. A source of read bit line pass gate 640 is connected to read port transistor 630. A drain of read bit line pass gate 640 is connected to read bit line RBL.

Read bit line pass gate 640 is configured to selectively connect the read bit line RBL to read port transistor 630. In operation, when read word line bar signal RWLB activates read bit line pass gate 640 and read bit line pass gate 640 is floating, a voltage level on read bit line RBL remains unchanged. When read word line bar signal RWLB activates read bit line pass gate 640 and read bit line pass gate 640 is connected to the operating voltage, a voltage level on read bit line RBL is pulled up to the operating voltage. A voltage level on read bit line RBL is usable to determine bit information stored in cross-coupled inverters 610.

Figure 7:
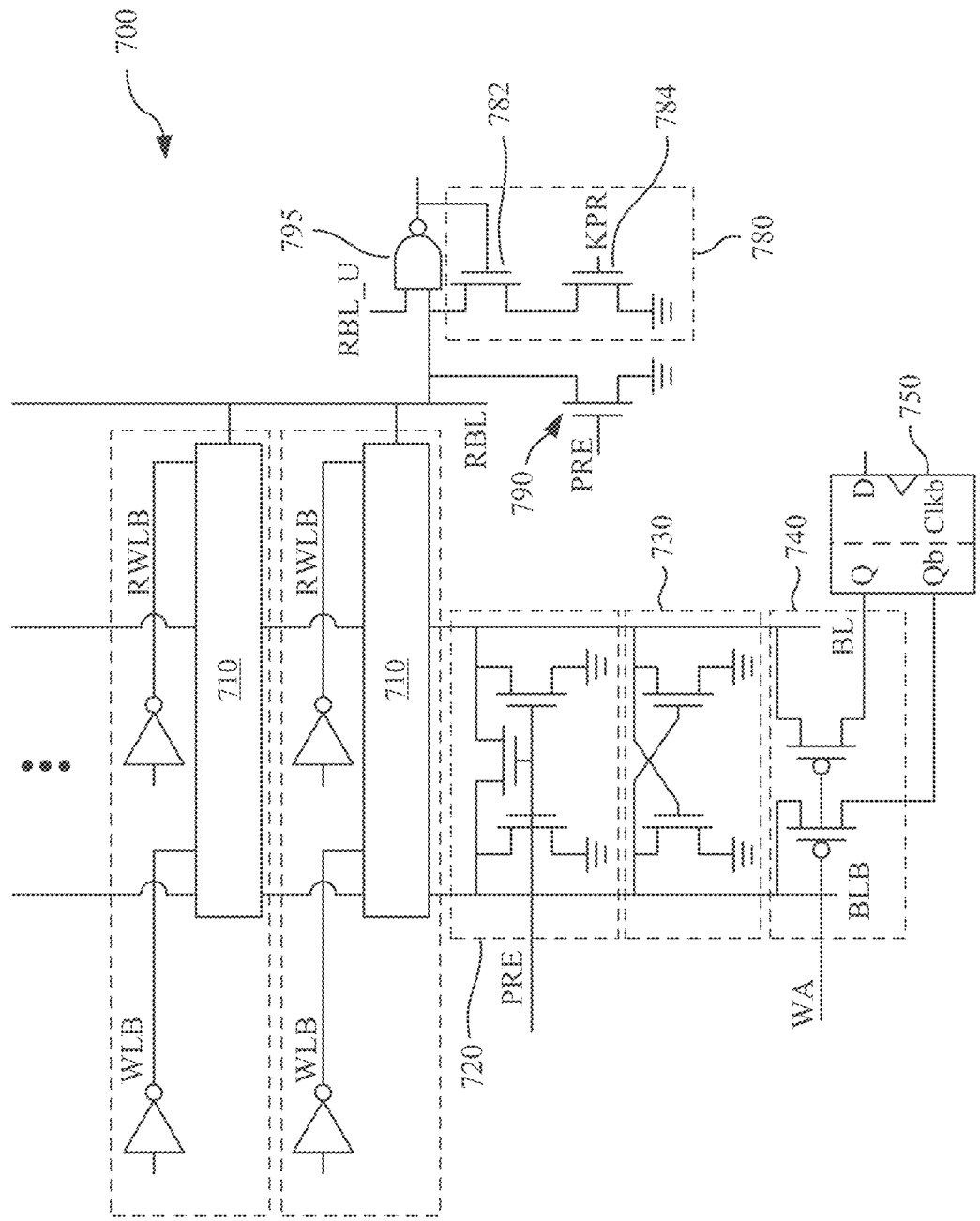
FIG. 7 is a schematic diagram of a two-port SRAM in accordance with some embodiments.

FIG. 7 is a schematic diagram of a two-port SRAM 700 in accordance with some embodiments. Two-port SRAM 700 includes a two-port bit cell 710 configured to receive a signal along word line bar WLB. Two-port bit cell 710 is connected to bit line BL and bit line bar BLB. Two-port SRAM 700 further includes a discharge circuit 720 configured to discharge bit line BL and bit line bar BLB to a reference voltage in response to a pre-discharge signal PRE. Two-port SRAM 700 further includes cross-coupled transistors 730 connected to bit line BL and bit line bar BLB. Cross-coupled transistors 730 are configured to help maintain a voltage level on bit line BL and bit line bar BLB. A write multiplexer 740 is also connected to bit line BL and bit line bar BLB. Write multiplexer 740 is configured to help maintain bit line BL or bit line bar BLB in a high logical state during a write operation. A flip-flop 750 is connected to write multiplexer 740. Two-port SRAM 700 further includes a read bit line RBL connected to two-port bit cell 710. Read bit line RBL is connected to a keeper circuit 780. Keeper circuit 780 is configured to maintain a voltage level on read bit line during a read operation. Read bit line RBL is also connected to a discharge transistor 790 configured to set a voltage level on the read bit line to the reference voltage in response to pre-discharge signal PRE. Read bit line RBL is also connected to a first input of a NAND gate 795. An upper read bit line RBL U, which is connected to a second column two-port bit cell (not shown), is connected to a second input of NAND gate 795. An output of NAND gate 795 is usable to determine bit information stored in two-port bit cell 710.

Two-port bit cell 710 is configured to store bit information. Two-port bit cell 710 includes p-type pass gates. In some embodiments, two-port bit cell 710 is an eight transistor (8T) bit cell. In some embodiments, two-port bit cell 710 is similar to two-port bit cell 600 (FIG. 6). In some embodiments, two-port bit cell 710 includes transistors having three dimensional gate structures, e.g., FinFET.

Two-port bit cell 710 is configured to receive a signal on word line bar WLB in order to selectively receive information from bit line BL and bit line bar BLB. Due to the p-type pass gates, the bit information is transferred from bit line BL and bit line bar BLB when the signal on word line bar WLB is logically low. Two-port bit cell 710 is configured to receive a signal on read word line bar RWLB in order to selectively transfer information to read bit line RBL. Due to the p-type read port transistor and read bit line transistor, e.g., read port transistor 630 (FIG. 6) and read bit line pass gate 640, the bit information is transferred to read bit line RBL when the signal on read word line bar RWLB is logically low. In some embodiments, an inverter is used to convert a logically high activation signal from peripheral circuitry to a logically low signal on word line bar WLB or read word line bar RWLB to activate two-port bit cell 710 for a write operation or a read operation. The inverter facilitates use of two-port SRAM 700 in integrated circuits without adjustments to the peripheral circuitry which are designed for use with bit cells having n-type pass gates and n-type read port transistors and read bit line transistors.

Pre-discharge circuit 720 has a similar structure as pre-discharge circuit 220. Cross-coupled transistors 730 have a similar structure as cross-coupled transistor 230. Write multiplexer 740 has a similar structure as write multiplexer 240. Flip-flop 750 has a similar structure as flip-flop 250.

Keeper circuit 780 includes a first n-type keeper transistor 782 having a gate connected to an output of NAND gate 795. A drain of first n-type keeper transistor 782 is connected to read bit line RBL. A source of first n-type keep transistor 782 is connected to a drain of a second n-type keeper transistor 784. A gate of second n-type keeper transistor 784 is configured to receive a keeper enabling signal KPR. A source of second n-type keeper transistor 784 is connected to the reference voltage.

Keeper circuit 780 is configured to help maintain a voltage level on read bit line RBL during a read operation. Keeper 780 is configured to provide sufficient current to compensate leakage current from other bit cells connected to read bit line. Use of n-type transistors in keeper circuit 780 helps to compensate for current leakage, as a result read correctness is guaranteed in comparison with the design without keeper circuits.

In operation, when an output of NAND gate 795 is logically high and keeper enabling signal KPR is logically high, read bit line RBL is connected to the reference voltage through first n-type keeper transistor 782 and second n-type keeper transistor 784. When either the output of NAND gate 795 is logically low or keeper enabling signal KPR is logically low, read bit line RBL is disconnected from the reference voltage.

Discharge transistor 790 includes a gate configured to receive pre-discharge signal PRE. A source of discharge transistor 790 is connected to the reference voltage. A drain of discharge transistor 790 is connected to read bit line RBL.

Discharge transistor 790 is configured to selectively connect read bit line RBL to the reference voltage to discharge a voltage level on the read bit line.

In operation, when pre-discharge signal PRE is logically high, read bit line RBL is connected to the reference voltage through discharge transistor 790. In some embodiments, discharge transistor 790 is activated prior to a read operation to set read bit line RBL to a voltage level equal to the reference voltage.

Figure 8:
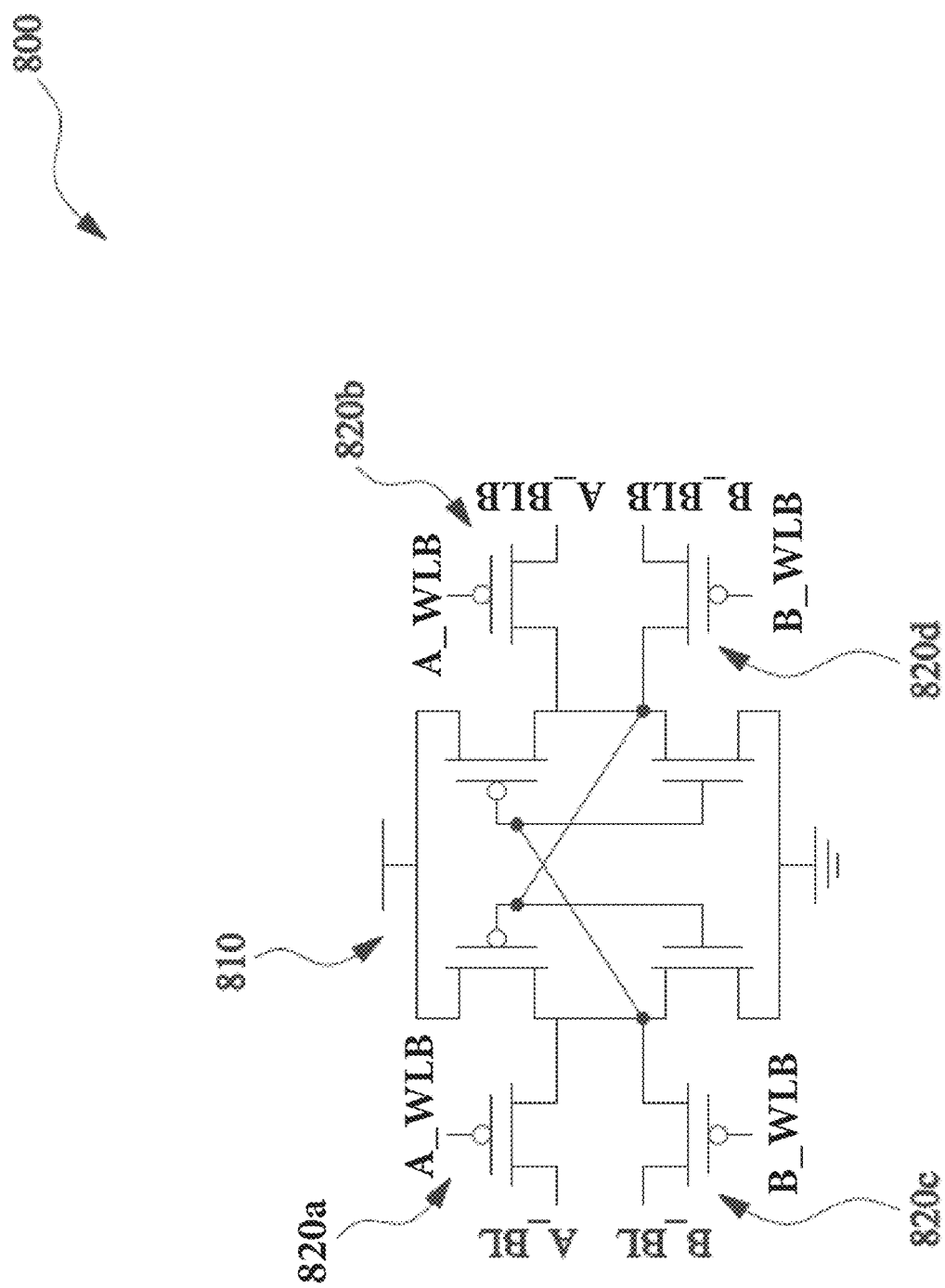
FIG. 8 is a schematic diagram of a dual-port bit cell in accordance with some embodiments.

FIG. 8 is a schematic diagram of a dual-port bit cell 800 in accordance with some embodiments. In contrast with single-port bit cell 100 (FIG. 1), dual-port bit cell 800 includes a third pass gate 820c and a fourth pass gate 820d in addition to a first pass gate 820a and a second pass gate 820b. The addition of third pass gate 820c and fourth pass gate 820d helps to facilitate performing a read operation and a write operation on dual-port bit cell 800 during a same cycle. First pass gate 820a and third pass gate 820c are connected to a first side of cross-coupled inverters 810. First pass gate 820a is configured to selectively connect the first side of cross-coupled inverters 810 to a first bit line A_BL. Third pass gate 820c is configured to selectively connect the first side of cross-coupled inverters 810 to a second bit line B_BL. Second pass gate 820b and fourth pass gate 820d are connected to a second side of cross-coupled inverters 810. Second pass gate 820b is configured to selectively connect the second side of cross-coupled inverters 810 to a first bit line bar A_BLB. Fourth pass gate 820d is configured to selectively connect the second side of cross-coupled inverters 810 to a second bit line bar B_BLB.

A gate of first pass gate 820a and a gate of second pass gate 820b are configured to receive a signal on a first word line bar A_WLB. A gate of third pass gate 820c and a gate of fourth pass gate 820d are configured to receive a signal on a second word line bar B_WLB.

Dual-port bit cell 800 includes p-type pass gates. In some embodiments, first pass gate 820a; second pass gate 820b; third pass gate 820c; and fourth pass gate 820d are all PMOS transistors. In some embodiments, first pass gate 820a; second pass gate 820b; third pass gate 820c; and fourth pass gate 820d include three-dimensional gate structures, e.g. FinFET.

In contrast with bit cells which include n-type transistors for pass gates, dual-port bit cell 800 is connected to first bit line A_BL; first bit line bar A_BLB; second bit line B_BL; and second bit line bar B_BLB by a logically low signal at a gate of first pass gate 820a; second pass gate 820b; third pass gate 820c; and fourth pass gate 820d, respectively.

By using p-type transistors for first pass gate 820a; second pass gate 820b; third pass gate 820c; and fourth pass gate 820d for scaled down semiconductor devices, bit information stored in cross-coupled inverters 110 is conveyed to first bit line A_BL; first bit line bar A_BLB; second bit line B_BL; or second bit line bar B_BLB more rapidly in comparison with scaled down semiconductor devices which include n-type transistors for pass gates.

Figure 9:
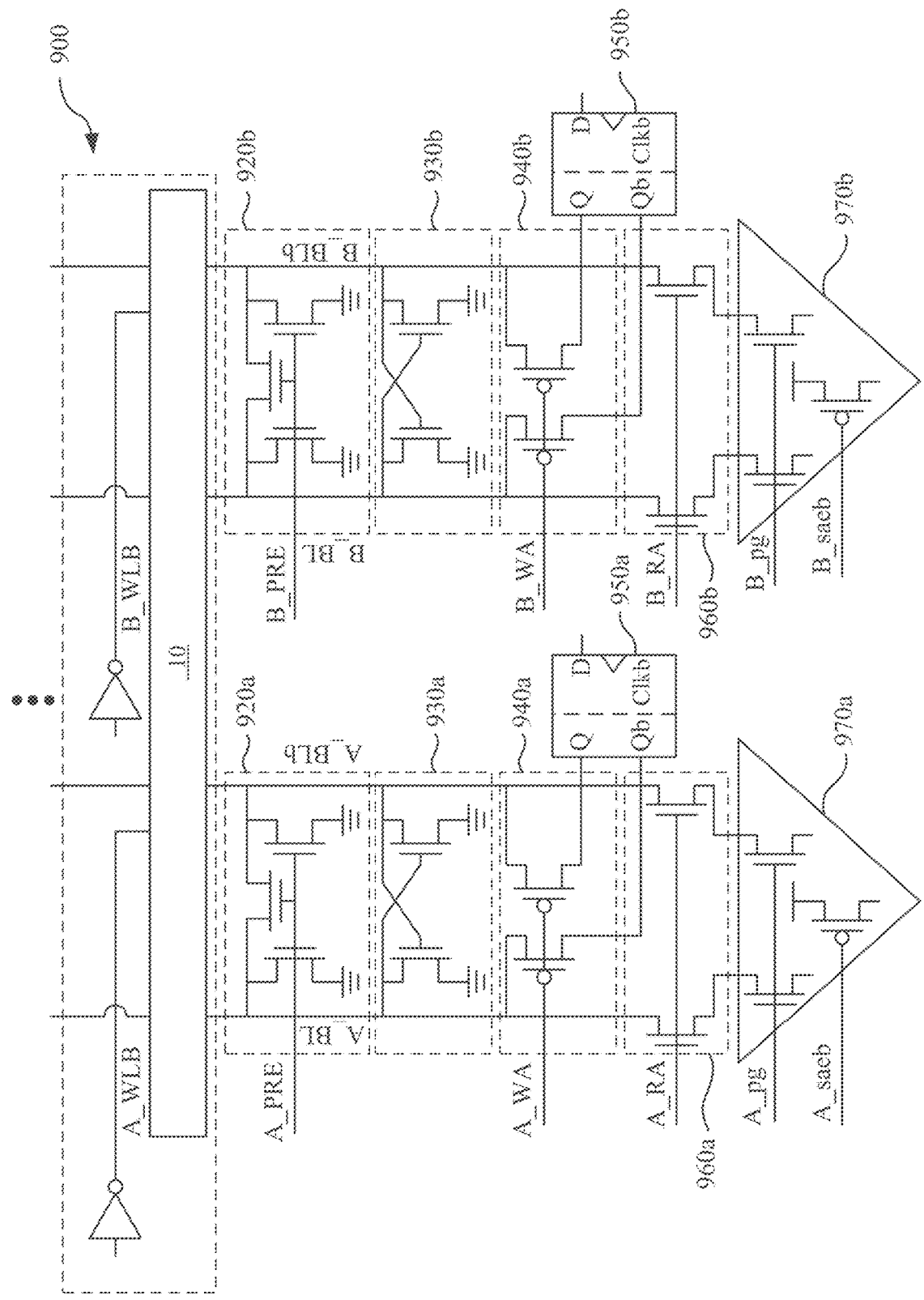
FIG. 9 is a schematic diagram of a dual-port SRAM in accordance with some embodiments.

FIG. 9 is a schematic diagram of a dual-port SRAM 900 in accordance with some embodiments. Dual-port SRAM 900 includes a dual-port bit cell 910 configured to receive a signal along first word line bar A_WLB and second word line bar B_WLB. Dual-port bit cell 810 is connected to first bit line A_BL; first bit line bar A_BLB; second bit line B_BL; and second bit line bar B_BLB. Dual-port SRAM 900 further includes a first discharge circuit 920a configured to discharge first bit line A_BL and first bit line bar A_BLB to a reference voltage in response to a first pre-discharge signal A_PRE. Dual-port SRAM 900 further includes a second discharge circuit 920b configured to discharge second bit line B_BL and second bit line bar B_BLB to a reference voltage in response to a second pre-discharge signal B_PRE. Dual-port SRAM 900 further includes first cross-coupled transistors 930a connected to first bit line A_BL and first bit line bar A_BLB. First cross-coupled transistors 930a are configured to help maintain a voltage level on first bit line A_BL and first bit line bar A_BLB. Dual-port SRAM 900 further includes second cross-coupled transistors 930b connected to second bit line B_BL and second bit line bar B_BLB. Second cross-coupled transistors 930b are configured to help maintain a voltage level on second bit line B_BL and second bit line bar B_BLB. A first write multiplexer 940a is also connected to first bit line A_BL and first bit line bar A_BLB. First write multiplexer 940a is configured to help maintain first bit line A_BL or first bit line bar A_BLB. in a high logical state during a write operation. A second write multiplexer 940b is also connected to second bit line B_BL and second bit line bar B_BLB. Second write multiplexer 940b is configured to help maintain second bit line B_BL or second bit line bar B_BLB. in a high logical state during a write operation. A first flip-flop 950a is connected to first write multiplexer 940a. A second flip-flop 950b is connected to second write multiplexer 940b. Dual-port SRAM 900 further includes a first read multiplexer 960a connected to first bit line A_BL and first bit line bar A_BLB. A first read multiplexer 960a is configured to transfer a voltage value close to the reference voltage to a first sense amplifier 970a during a reading operation. First sense amplifier 970a is also connected to first bit line A_BL and first bit line bar A_BLB. Dual-port SRAM 900 further includes a second read multiplexer 960b connected to second bit line B_BL and second bit line bar B_BLB. A second read multiplexer 960b is configured to transfer a voltage value close to the reference voltage to a second sense amplifier 970b during a reading operation. Second sense amplifier 970b is also connected to second bit line B_BL and second bit line bar B_BLB.

Dual-port bit cell 910 is configured to store bit information. Dual-port bit cell 910 includes p-type pass gates. In some embodiments, dual-port bit cell 910 is an eight transistor (8T) bit cell. In some embodiments, dual-port bit cell 910 is similar to dual-port bit cell 800 (FIG. 8). In some embodiments, dual-port bit cell 910 includes transistors having three dimensional gate structures, e.g., FinFET.

Dual-port bit cell 910 is configured to receive a signal on first word line bar A_WLB and second word line bar B_WLB in order to be selectively connected to first bit line A_BL; first bit line bar A_BLB; second bit line B_BL; or second bit line bar B_BLB. In some embodiments, an inverter is used to convert a logically high activation signal from peripheral circuitry to a logically low signal on first word line bar A_WLB or second word line bar B_WLB to activate dual-port bit cell 910 for a write operation or a read operation. The inverter facilitates use of dual-port SRAM 900 in integrated circuits without adjustments to the peripheral circuitry which are designed for use with bit cells having n-type pass gates.

First pre-discharge circuit 920a and second pre-discharge circuit 920b each have a similar structure as pre-discharge circuit 220 (FIG. 2). First cross-coupled transistors 930a and second cross-coupled transistor 930b each have a similar structure as cross-coupled transistor 230. First write multiplexer 940a and second write multiplexer 940b each have a similar structure as write multiplexer 240. First flip-flop 950a and second flip-flop 950b each have a similar structure as flip-flop 250. First sense amplifier 970a and second sense amplifier 970b each have a similar structure as sense amplifier 270.

Figure 10:
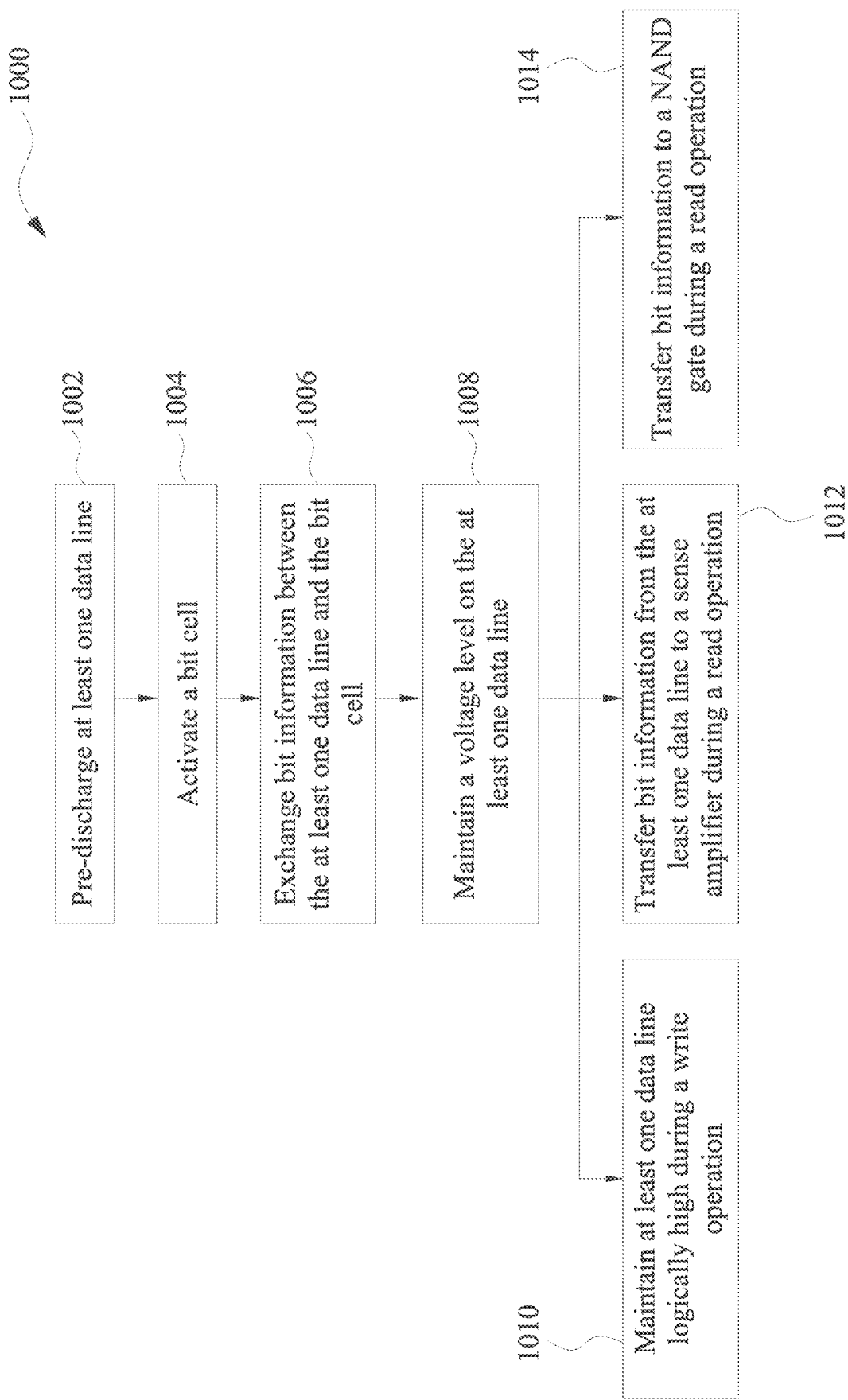
FIG. 10 is a flow chart of a method of using an SRAM in accordance with some embodiments.

FIG. 10 is a flow chart of a method 1000 of using an SRAM in accordance with some embodiments. Method 100 begins with pre-discharging at least one data line in operation 1002. Pre-discharging at least one data line includes setting a voltage level on the at least one data line to the reference voltage. In some embodiments, the at least one data line includes bit line BL and bit line bar BLB (FIG. 2). In some embodiments, the at least one data line includes read bit line RBL (FIG. 7). In some embodiments, the at least one data line includes first write line bar A_WLB and second write line bar B_WLB in order to be selectively connected to first bit line A_BL; first bit line bar A_BLB; second bit line B_BL; and second bit line bar B_BLB (FIG. 9).

In some embodiments, the at least one data line is discharged using pre-discharge circuit 220 (FIG. 2) or pre-discharge circuit 720 (FIG. 7). In some embodiments, the at least one data line is discharged using discharge transistor 790. In some embodiments, the at least one data line is discharged using first pre-discharge circuit 920a or second pre-discharge circuit 920b (FIG. 9).

Method 1000 continues with operation 1004 in which a bit cell is activated. In some embodiments, the bit cell is a single-port bit cell, e.g., single-port bit cell 210 (FIG. 2). In some embodiments, the bit cell is a two-port bit cell, e.g., two-port bit cell 710 (FIG. 7). In some embodiments, the bit cell is a dual-port bit cell, e.g., dual-port bit cell 910 (FIG. 9).

In some embodiments, the bit cell is activated by a signal on word line bar WLB (FIG. 2). In some embodiments, the bit cell is activated by a signal on read word line bar RWLB (FIG. 7). In some embodiments, the bit cell is activated by a signal on first word line bar A_WLB or second word line bar B_WLB (FIG. 9).

In operation 1006, bit information is exchanged between the at least one data line and the bit cell. In a read operation, bit information is transferred from the bit cell to the at least one data line. In some embodiments, the bit information is transferred from the bit cell to a bit line or a bit line bar using a p-type pass gate. In some embodiments, the bit information is transferred from the bit cell to a read bit line using a p-type read port transistor. In a write operation, bit information is transferred from the at least one data line to the bit cell. The bit information is transferred from a bit line or a bit line bar to the bit cell through a p-type pass gate.

Method 1000 continues with operation 1008, in which a voltage level on the at least one data line is maintained. In some embodiments, the voltage level on the at least one data line is maintained using cross-coupled transistors 230 (FIG. 2) or cross-coupled transistors 730 (FIG. 7). In some embodiments, the voltage level on the at least one data line is maintained using keeper circuit 780. In some embodiments, the voltage level on the at least one data line is maintained using first cross-coupled transistors 930a or second cross-coupled transistors 930b (FIG. 9).

In operation 1010, the at least one data line is maintained at a logically high voltage level during a write operation. In some embodiments, bit line BL or bit line bar BLB is maintained at a logically high voltage by write multiplexer 240 (FIG. 2). In some embodiments, bit line BL or bit line bar BLB is maintained at a logically high voltage by write multiplexer 740 (FIG. 7). In some embodiments, first bit line A_BL or first bit line bar A_BLB is maintained at a logically high voltage by first write multiplexer 940a (FIG. 9). In some embodiments, second bit line B_BL or second bit line bar B_BLB is maintained at a logically high voltage by second write multiplexer 940b.

In operation 1012, bit information is transferred from the at least one data line to a sense amplifier during a read operation. In some embodiments, the bit information is transferred from bit line BL or bit line bar BLB to sense amplifier 270 by read multiplexer 260 (FIG. 2). In some embodiments, the bit information is transferred from first bit line A_BL or first bit line bar A_BLB to first sense amplifier 270a by first read multiplexer 960a (FIG. 9). In some embodiments, the bit information is transferred from second bit line B_BL or second bit line bar B_BLB to second sense amplifier 270b by second read multiplexer 960b.

In operation 1014, bit information is transferred to a NAND gate during a read operation. In some embodiments, the bit information is transferred to NAND gate 795 from read bit line RBL (FIG. 7).

One of ordinary skill in the art would recognize that operations are able to be removed or that additional operations are able to be added to method 1000 without departing from the scope of this description. One of ordinary skill in the art would also recognize that an order of operations in method 1000 is able to be adjusted without departing from the scope of this description.

In some embodiments, a method of performing a write operation on an SRAM bit cell includes activating the bit cell by supplying a signal to a p-type pass gate of the bit cell, the signal causing the p-type pass gate to be in a conductive state, using a p-type transistor of a write multiplexer to maintain a data line at a logically high voltage, and transferring bit information from the data line to the activated bit cell using the p-type pass gate.

In some embodiments, a method of performing a read operation on an SRAM bit cell includes activating the bit cell by supplying a signal to a p-type pass gate of the bit cell, the signal causing the p-type pass gate to be in a conductive state, and transferring bit information from the activated bit cell to a data line using the p-type pass gate.

In some embodiments, a method of performing a write operation on an SRAM bit cell includes activating the bit cell by supplying a signal to first and second p-type pass gates of the bit cell, the signal causing each of the first and second p-type pass gates to be in a conductive state, transferring complementary bit information from the activated bit cell to a first data line using the first p-type pass gate and to a second data line using the second p-type pass gate, and transferring the complementary bit information from the first and second data lines to a sense amplifier using n-type transistors of a read multiplexer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of performing a write operation on a static random access memory (SRAM) bit cell, the method comprising:
    activating the bit cell by supplying a signal to a p-type pass gate of the bit cell, the signal causing the p-type pass gate to be in a conductive state;
    using a p-type transistor of a write multiplexer to maintain a data line at a logically high voltage; and
    transferring bit information from the data line to the activated bit cell using the p-type pass gate.

2. The method of claim 1, wherein the transferring the bit information from the data line to the activated bit cell using the p-type pass gate comprises using a p-type, fin field-effect-transistor (FinFET) pass gate.

3. The method of claim 1, wherein the supplying the signal to the p-type pass gate comprises using an inverter to convert a logically high activation signal from peripheral circuitry to a logically low voltage.

4. The method of claim 3, further comprising interrupting power to the peripheral circuitry using an n-type transistor of a footer before or after performing the write operation.

5. The method of claim 1, wherein the using the p-type transistor of the write multiplexer to maintain the data line at the logically high voltage comprises using the p-type transistor of the write multiplexer to connect the data line to an output of a flip-flop.

6. The method of claim 1, wherein
    the p-type pass gate of the bit cell is a first p-type pass gate of the bit cell,
    the activating the bit cell comprises supplying the signal to a second p-type pass gate of the bit cell,
    the data line is a first data line,
    the transferring the bit information from the data line to the activated bit cell comprises using the second p-type pass gate to transfer complementary bit information from a second data line to the activated bit cell,
    the p-type transistor of the write multiplexer is a first p-type transistor of the write multiplexer, and
    the using the p-type transistor of the write multiplexer to maintain the data line at the logically high voltage comprises:
        using the first p-type transistor of the write multiplexer to connect the first data line to a first output of a flip-flop; and
        using a second p-type transistor of the write multiplexer to connect the second data line to a second output of the flip-flop.

7. The method of claim 1, further comprising using cross-coupled n-type transistors to maintain the data line at the logically high voltage.

8. A method of performing a read operation on a static random access memory (SRAM) bit cell, the method comprising:
    activating the bit cell by supplying a signal to a p-type pass gate of the bit cell, the signal causing the p-type pass gate to be in a conductive state; and
    transferring bit information from the activated bit cell to a data line using the p-type pass gate.

9. The method of claim 8, wherein the transferring the bit information from the activated bit cell to the data line using the p-type pass gate comprises using a p-type, fin field-effect-transistor (FinFET) pass gate.

10. The method of claim 8, wherein the supplying the signal to the p-type pass gate comprises using an inverter to convert a logically high activation signal from peripheral circuitry to a logically low voltage.

11. The method of claim 10, further comprising interrupting power to the peripheral circuitry using an n-type transistor of a footer before or after performing the read operation.

12. The method of claim 8, further comprising transferring the bit information from the data line to a sense amplifier using an n-type transistor of a read multiplexer.

13. The method of claim 8, further comprising using an n-type transistor to pre-discharge the data line to a reference voltage.

14. The method of claim 8, wherein the transferring bit information from the activated bit cell to the data line comprises transferring the bit information to an input of a NAND gate.

15. The method of claim 14, further comprising using an output of the NAND gate and an n-type keeper transistor to maintain a voltage on the data line.

16. A method of performing a read operation on a static random access memory (SRAM) bit cell, the method comprising:

activating the bit cell by supplying a signal to first and second p-type pass gates of the bit cell, the signal causing each of the first and second p-type pass gates to be in a conductive state;

transferring complementary bit information from the activated bit cell to a first data line using the first p-type pass gate and to a second data line using the second p-type pass gate; and transferring the complementary bit information from the first and second data lines to a sense amplifier using n-type transistors of a read multiplexer.

17. The method of claim 16, further comprising using a plurality of n-type transistors to pre-discharge each of the first and second data lines to a reference voltage.

18. The method of claim 16, wherein the transferring the complementary bit information from the first and second data lines to the sense amplifier comprises using a pair of n-type pass gates of the sense amplifier to transfer the complementary bit information from the read multiplexer to a pair of cross-coupled inverters of the sense amplifier.

19. The method of claim 18, further comprising using a plurality of n-type pre-discharge transistors of the sense amplifier to pre-discharge each terminal of the cross-coupled inverters to a reference voltage.

20. The method of claim 16, further comprising using a pair of cross-coupled n-type transistors to maintain voltage levels on the first and second data lines.

* * * * *